(12) United States Patent
Viero et al.

(10) Patent No.: US 7,524,698 B2
(45) Date of Patent: Apr. 28, 2009

(54) HANDLING AND POSITIONING OF METALLIC PLATED BALLS FOR SOCKET APPLICATION IN BALL GRID ARRAY PACKAGES

(75) Inventors: Giorgio Viero, Stezzano (IT); Stefano Sergio Oggioni, Milan (IT); Michele Castriotta, Manfredonia (IT)

(73) Assignee: International Business Machines Corporation, Armonk, NY (US)

( * ) Notice: Subject to any disclaimer, the term of this patent is extended or adjusted under 35 U.S.C. 154(b) by 488 days.

(21) Appl. No.: 11/164,711

(22) Filed: Dec. 2, 2005

(65) Prior Publication Data

US 2006/0255461 A1    Nov. 16, 2006

(30) Foreign Application Priority Data

Dec. 2, 2004   (EP)   ................... 04106241

(51) Int. Cl.
*H01L 21/44* (2006.01)
*H01L 21/48* (2006.01)

(52) U.S. Cl. .............. 438/106; 438/109; 438/111; 438/112; 438/118; 438/119; 228/246; 228/254; 228/56.3

(58) Field of Classification Search ............ 438/106, 438/109, 111, 112, 118, 119; 228/245, 246, 228/56.3
See application file for complete search history.

(56) References Cited

U.S. PATENT DOCUMENTS

| 5,060,844 | A | 10/1991 | Behun et al. |
| 5,118,027 | A | 6/1992 | Braun et al. |
| 6,168,976 | B1 | 1/2001 | Haley et al. |
| 6,404,047 | B1 | 6/2002 | Haley et al. |
| 6,881,612 | B2 * | 4/2005 | Miyasaka ............ 438/118 |

* cited by examiner

*Primary Examiner*—Kenneth A Parker
*Assistant Examiner*—Joseph Nguyen
(74) *Attorney, Agent, or Firm*—Todd M. C. Li

(57) ABSTRACT

A method and apparatus for handling and positioning half plated balls for socket application in ball grid array packages. The half plated balls, comprising a first side adapted to be soldered and a second side adapted to establish reliable solderless electrical contact, are embedded in a soft foil, with a common orientation. The soft foil is positioned on a clam-receiving tool and a vacuumed caved cover clam is fitted on the balls and then pushed to cut and separate the polymer sheet from the copper ball surface. The vacuumed caved cover clam is then lifted with the oriented copper balls entrapped inside and the vacuumed caved cover clam places the entrapped balls on the laminate pads, with a deposit of low melt alloy. The air vacuum is deactivated and the cover is lifted, leaving the balls positioned on the pads while the soldering process is initiated and solder joints are formed to fix the balls.

9 Claims, 7 Drawing Sheets

HANDLING AND POSITIONING OF METALLIC PLATED BALLS FOR SOCKET APPLICATION IN BALL GRID ARRAY PACKAGES

FIELD OF THE INVENTION

The present invention relates generally to electronic packages and more specifically to a method for handling and positioning metallic plated balls for socket application in ball grid array packages.

BACKGROUND OF THE INVENTION

Plastic Ball Grid Array (PBGA) module, with low-melt alloy balls, represents an evolution of electronic modules from the classical ceramic substrate. Historically, ceramic carriers use arrays of pins plated with Gold for mounting into sockets. These pins are then inserted into sockets that have mating surfaces also plated with Gold. Good contacts are realized by the utilization of spring loaded or clamping mechanisms.

The new industry trend of using cheaper materials lead to the use of Input/Output technologies that are based upon matrix of balls made of soldering alloys for transmitting electrical signal between electronic modules and Printed Circuit Boards (PCBs). This generates a migration away from sockets toward direct soldering. This interconnection technique is also called Solder Ball Connection (SBC).

These new Input/Output technologies are extensively implemented in low cost applications from consumer electronics to personal computers, and are rapidly moving toward the high end computing sector. However, in this specific market segment, particular requirements need to be met, like the necessity of component field replacement and upgradeability as well as the module level Burn-In testing. This was done in the past with the Pin Grid Array (PGA) packages having Gold plated pins inserted in Gold plated socket receptacles, and later using Land Grid Array (LGA) technology, where the pins where removed, leaving a Gold plated pad pressed against a similar metalized pad (Pad on Pad) on the PCB through an anisotropic conductive elastomer. But this is now becoming an unaffordable cost and technically difficult for organic substrate that are relatively softer than ceramic carriers, and cannot withstand the amount of pressure required to obtain a low ohmic contact resistance values. Furthermore, microprocessors and complex Application Specific Integrated Circuit (ASICS) are growing in size and the associated costs to PGA or LGA solutions for large body sizes are becoming prohibitive in their manufacturing costs and mostly in their implementation into products. SBC-like packaging is now being considered for microprocessors and lack of plugability remains a major hurdle to use this technology.

Electronic modules generally use a rigid (plastic, ceramic) or flexible (polyimide) substrates that are then attached, usually by soldering techniques, to electronic circuits embedded into PCB substrates.

Soldering technology implies a higher level of complexity for the part replacement, which can be accomplished only by the usage of industrial processes (desoldering, cleaning, and soldering of new component), while the positioning of module into sockets allows the replacement of the same in the field without the need of special processes, maybe requiring just a mechanical extractor tool.

On the other hand, the soft nature of the BGA ball materials require handling procedures and special probes characteristics to manage the level of penetration of the latter into the solder alloy bulk. Furthermore, soldering alloys contain metals like Tin, Copper, Silver, Indium, Bismuth and Zinc that are easily oxidizing when exposed to air and temperature excursions. Oxide layers prevent good electrical contacts between module and socket pins unless the socket contact probes are designed to break the oxide layer but, even in this case, this is just a temporary solution due to the unavoidable oxidation of the newly exposed material in due time. Oxidation of contacts leads to an increasing contact resistance drift that ultimately will generate intermittent/full electrical failures of the module and consequently in the systems.

A solution to this problem consists in providing a semi-plated or half plated Copper sphere that is compatible with the contact surface requirements of sockets e.g., Gold to Gold dry contact, on one side of the sphere and a reliable soldering surface e.g., a soldering surface protected against the formation of Gold/Tin and Tin/Nickel intermetallics, and offering the standard and proven reliable soldering system interface on the other side e.g., Copper/Tin interface.

However, if such technique provides good electrical (solder and solderless) connections, it is not easy to implement in real manufacturing processes since balls must be well oriented before being positioned and soldered. U.S. Pat. No. 6,404,047 discloses a method for positioning the balls that are embedded in a polymer sheet. According to this method, socketable balls are mounted to a BGA package by first placing the balls into the pockets or holes of a tray that are sized such that when the balls are inserted, an upper portion of the ball protrudes above a planar surface of the tray. A layer of polymer is then applied over the balls and a top area of each of the balls is exposed, and coated with solder. During the plating step the polymer provides a solder-tight seal against each of the balls such that, except for the top area, the rest of the surface area of the balls remains solder-free. The solder-plated top area of each of the balls is then soldered to the corresponding plurality of lands of the package by reflowing the solder to establish electrical contact therebetween.

The handling method disclosed in the above mentioned patent presents some drawbacks. In particular, the handling of the polymer foil embedding balls is not easy. Due to the thickness of the polymer foil, it is soft and elastic. As a consequence, it is not easy to manipulate this polymer foil nor to control the distances between spheres when positioned (this could lead to misplacements of the spheres). Furthermore, the polymer foil must not be folded because the spheres would free themselves. A further drawback is the deposition of solder paste by screen-printing. Such a wet deposit is achievable after aligning a stencil with openings over the embedded matrix of balls. The precise alignment of a hard mask over the balls of the polymer foils that is not a flat surface, requires either high precision tools to deposit a controlled amount of alloy increasing operational costs or a lower level of precision depositing great amount of alloy supplying a worse configuration for the following metallurgical interactions. There may also be weights implications in a straight lay up of the substrate over a matrix of embedded balls with screen-printed solder alloy deposit. The deposit may get squashed by the substrate placing operation or by the same weight of it pushing the solder alloy deposit into the gaps between balls positions enabling electrical shorts.

SUMMARY OF THE INVENTION

Thus, it is a broad object of the invention to remedy the shortcomings of the prior art as described here above.

It is another object of the invention to provide a method and apparatus for handling half plated balls for socket application in ball grid array packages while maintaining the relative orientation of the balls.

It is a further object of the invention to provide a method and apparatus for positioning half plated balls for socket application in ball grid array packages while maintaining the relative orientation of the balls.

The accomplishment of these and other related objectives is achieved by a method for handling at least one oriented half plated ball embedded in a foil in such a way that said at least one oriented half plated ball protrudes on both faces of said foil, using a caved-cover clam comprising at least one cavity having the shape and the size of approximately half of said half plated ball, said method comprising the steps of, positioning said foil comprising said at least one oriented half plated ball on a clam receiving tool;

fitting said caved-cover clam on said at least one oriented half plated ball and separating said foil from said at least one oriented half plated ball;

lifting the caved-cover clam entrapping said at least one oriented half plated ball in said at least one cavity;

positioning the clam covered-clam according to the target position of said at least one oriented half plated ball;

freeing said at least one oriented half plated ball; and, lifting the caved-cover clam.

The invention further provides an apparatus for handling at least one oriented half plated ball embedded in a foil such that said at least one oriented half plated ball protrudes on both faces of said foil, said apparatus comprising:

a caved-cover clam comprising at least one cavity having the shape and the size of approximately half of said half plated ball, said caved-cover clam entrapping said at least one oriented half plated ball in said at least one cavity; and a foil comprising said at least one oriented half plated ball on a clam receiving tool, said caved-cover clam fitted on said at least one oriented half plated ball and separating said foil from said at least one oriented half plated ball.

Further advantages of the present invention will become apparent to the ones skilled in the art upon examination of the drawings and detailed description. It is intended that any additional advantages be incorporated herein.

BRIEF DESCRIPTION OF THE DRAWINGS

FIG. 4, comprising

FIG. 6, comprising

DETAILED DESCRIPTION OF THE PREFERRED EMBODIMENT

Figure 1:
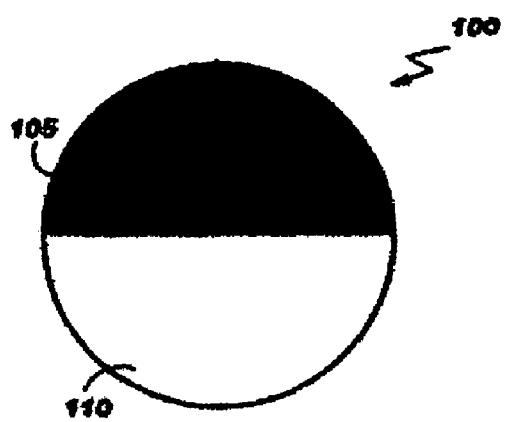
FIG. 1 shows a half plated ball adapted to be mounted on a socketable Ball Grid Array packages.

The main concept of this invention consists in providing a method for handling and positioning semi-plated or half plated Copper spheres that are compatible with the contact surface requirements of sockets e.g., Gold to Gold dry contacts, on one side of the spheres and a reliable soldering surface e.g., a soldering surface protected against the formation of Gold/Tin and Tin/Nickel intermetallics, and offering the standard and proven reliable soldering system interface on the other side e.g., Copper/Tin interface. An example of such half plated spheres or balls is illustrated on FIG. 1. As shown, the ball 100 comprises a first part 105 plated with a first material adapted for soldering operation and a second part 110 plated with a second material, preferably a noble metal, adapted for establishing reliable solderless electrical contact. Ball 100 can be made of Copper or can be fully or partially plated with Copper (105) that is adapted for soldering operation and half plated with Nickel-Gold (110).

Figure 2:
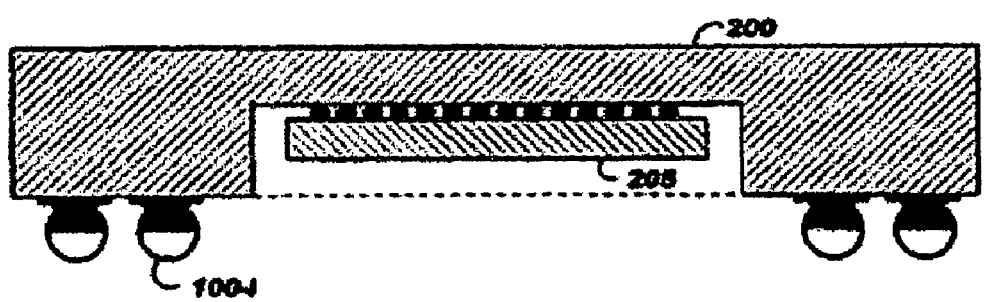
FIG. 2 illustrates a section view of a socketable Ball Grid Array package comprising half plated balls.

FIG. 2 illustrates a Ball Grid Array (BGA) module 200 comprising a cavity adapted for receiving a semiconductor chip 205 that can be mounted according to flip-chip technology as illustrated. BGA module 200 comprises several half plated balls, generically referred to as 100-$i$, that are soldered to the module using the Copper plated part. As shown, the half plated balls are positioned on the module in such a way that the parts plated with noble metal are in contact with the receiving Input/Output of the socket when the module is inserted therein.

In a preferred embodiment the balls are attached to the organic package with a process that makes them fully compatible with the set of tools and equipment currently available in the manufacturing lines. The basic copper balls have preferably common dimensions, as the current industry standard requirements, compatible with the interconnect pitch and socket. As mentioned above, the Copper balls are also partially plated with a Nickel metal layer, before the plating finishing, that is the pre-treatment required for the Gold or Palladium finishing based on standard processes. However, this plating of Nickel layer can be avoided with the use of new technology offering a Gold finishing directly on Copper, avoiding the intermediate Nickel deposition step.

Figure 3:
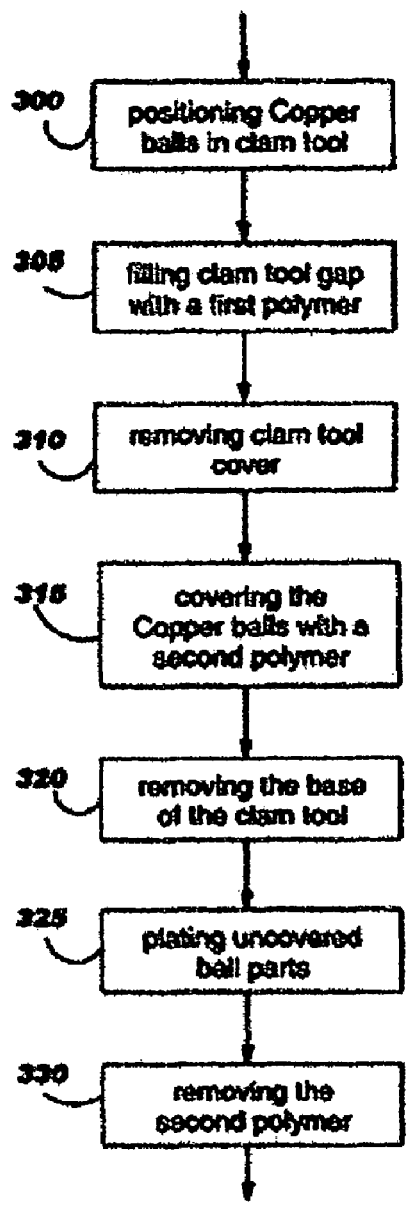
FIG. 3 depicts the main steps of an example of a method to manufacture half plated balls.

FIG. 3 depicts an algorithm illustrating the main steps of a method for manufacturing half plated balls. In this example, the method is based upon the use of Copper balls however, these balls can be made of other materials and plated with Copper or any other solderable material. Still for sake of illustration, it is assumed that diameter of balls is approximately equal to 0.9 mm, one of the diameters in compliance with international industry standards, i.e. JEDEC (JEDEC Solid State Technology Association once known as the Joint Electron Device Engineering Council) defines accepted spheres diameters in its Solid State Product Outlines for plastic and ceramic packages (0.4, 0.5, 0.6, 0.762, and 0.9 mm). Naturally, a tolerance is given for each predefined diameter. For example, concerning diameter 0.6 mm, the minimum diameter can be 0.5 mm and the maximum diameter can be 0.7 mm, concerning diameter 0.762 mm, the minimum diameter can be 0.6 mm and the maximum diameter can be 0.9 mm, and concerning diameter 0.4 mm, the minimum diameter can be 0.35 mm and the maximum diameter can be 0.45 mm.

The first step (step 300) consists in positioning the Copper Balls in a clam tool comprising two parts, a lower part, also referred to as clam tool base, and an upper part, also referred to as clam tool cover. The lower and upper parts comprise aligned cavities, or recesses, arranged on the inner planar surface of each clam tool parts in such a way that, when Copper balls are positioned in the recesses, the lower and upper parts are not in contact. In a preferred embodiment, the gap between inner planar surface of each clam tool parts is comprised between 0.15 mm and 0.6 mm, a preferred value is approximately 0.30 mm i.e., 33 percent of the diameter of the ball. The gap between the clam tool parts must be large enough for injecting polymer but smaller than ball diameter so that a part of the ball is positioned in a recess of each clam tool part. Practically, the gap between the clam tool parts is chosen in the range of 15 to 75 percent of the diameter of the ball. The clam tool part can be made, for example, of fine grain graphite.

The positioning of the recesses formed in the clam tool parts is not important, the only requirement is that recesses of both clam tool parts are aligned. However, for improving manufacturing process, recesses are preferably disposed according to the final disposition of half plated balls on the modules thus allowing a direct transfer when being soldered as discussed hereunder. Naturally, each clam tool part can comprise recesses corresponding to several modules.

Then, the inside gaps between the lower and upper clam tool parts i.e., the clearance areas through the Copper balls, are filled e.g., by injection, with a first polymer chemical solution (step 305). Examples of such a polymer chemical solution includes, but are not limited to, an epoxy, polyester, cyanate ester, bismaleimide triazine, benzo-cyclobutene, poly-phenilene ether, annylated poly-phenilene ether, polynorborene, liquid crystal polymer (LCP), poly-tetra-fluoro-ethylene, polyimide, or resinous material, and mixture thereof, as it is conventionally known, mixed with a cathalyst, and a filler, and possibly with other additives to influence specific properties. After the polymerization of the first polymer chemical solution, the cover, or upper clam tool part, is removed (step 310) and the top side of the Copper balls is fully covered with a second polymer (step 315). The second polymer can be one of the temporary protection masks used in plating processes and based on natural acrylic latex, or chlorine-free polyolefin-based plastisol or organosol, or plastisol composition comprising polyvinyl chloride, a plasticizer, a stabilizer and highly crosslinked nitrile rubber. Furthermore, other polymers using specifically selected additive as releasing agent can be used such as epoxy, polyester, cyanate ester, bismaleimide triazine, benzo-cyclobutene, poly-phenilene ether, annylated poly-phenilene ether, polynorborene, liquid crystal polymer (LCP), poly-tetra-fluoro-ethylene, polyimide or resinous material, and mixture thereof, as it is conventionally known mixed with a cathalyst and a filler.

After the polymerization of the second polymer, the base of the clam tool is removed (step 320) and the bottom side of the Copper balls that is not caught by the first and second polymer material is plated with a noble metal (step 325). As mentioned above, Nickel is generally plated before Gold or Palladium.

When the Copper balls are half or partially plated, the second polymer is removed (step 330) using, for example in the case of temporary protection mask based on natural acrylic latex, a peeling action separating the two films. A further selective stripping methodology can be the combination of polymers utilizing different stripping chemistries being soluble in alkali, acidic, or solvent baths. Therefore, at the end of the process, the half plated Copper balls are caught in a thin polymer layer. All the half plated Copper balls are positioned in the same direction i.e., the parts that are on one side of the thin polymer layer are made of or plated with solderable material while the parts that are on the other side of the thin polymer layer are plated with noble metal.

A partial replication of the aforementioned steps may allow proceeding with different platings of the base metal spheres delivering a final product with a multiple metal interface finishing along the sphere surface.

Figure 4A:
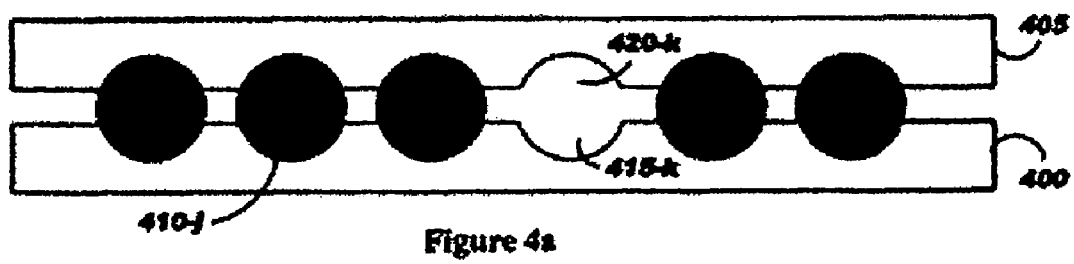
FIGS. 4a to 4h, depicts the main states of a ball when being half plated according to the method illustrated on FIG. 3.

FIGS. 4a to 4h illustrate the steps of the method according to the invention for manufacturing half plated balls shown on FIG. 3. FIG. 4a shows the lower part (400) of a used clam tool, or clam tool base, and the upper part (405), or clam tool cover. As illustrated, lower and upper parts 400 and 405 comprise recesses wherein Copper balls, generically referred to as 410-$j$, can be positioned. For sake of illustration, a couple of corresponding recesses (415-$k$ and 420-$k$) do not hold a Copper ball.

Figure 4B:
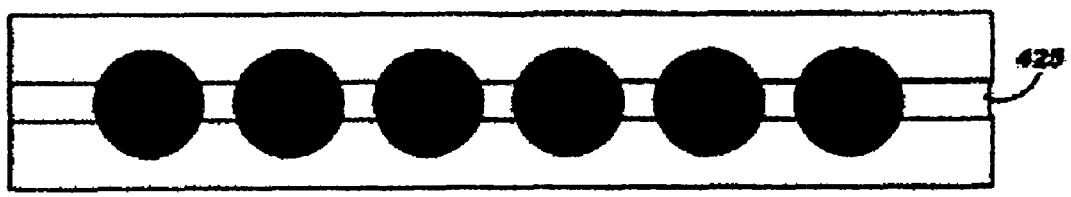
Figure 4C:
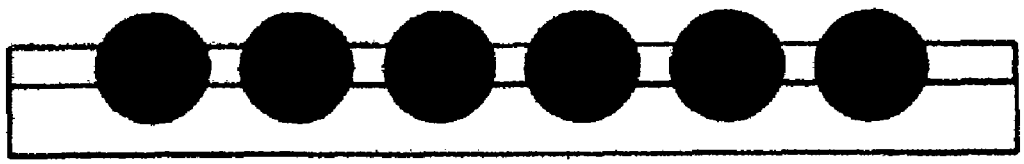

FIG. 4b depicts the clam tool holding Copper balls, after the first polymer chemical solution 425 has been injected in the gap formed between the clam tool parts 400 and 405 as described by reference to step 305. FIG. 4c shows the same when clam tool cover 405 is removed after the polymerization of the first polymer chemical solution.

Figure 4D:
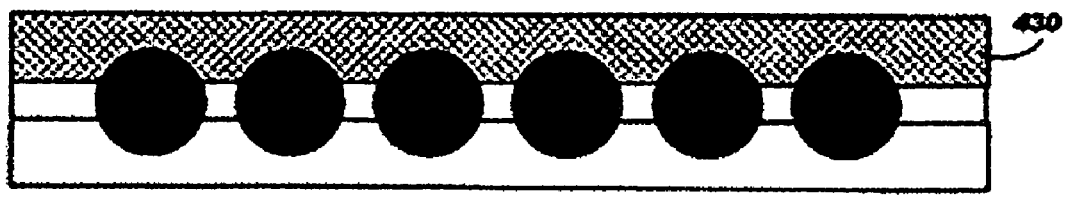
Figure 4E:
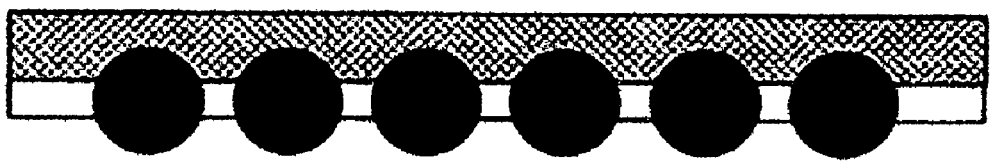

FIG. 4d illustrates the step of covering the Copper balls with the second polymer 430 (step 315) and FIG. 4e depicts the same when the base of the clam tool (400) is removed after the polymerization of the second polymer.

Figure 4F:
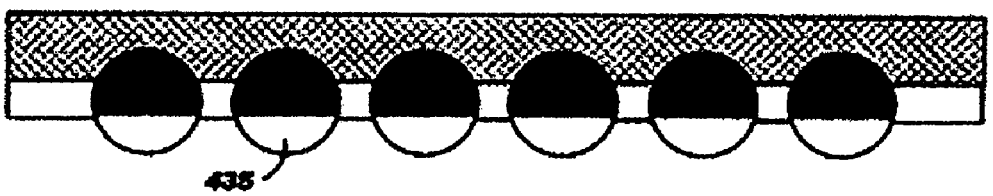
Figure 4G:
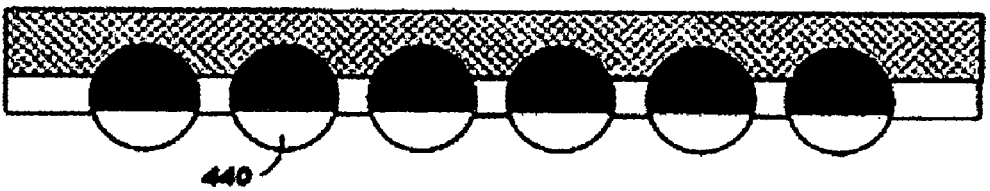

FIG. 4f shows the plating of the bottom side of the Copper balls that is not caught by the polymer material, with Nickel 435. As mentioned above, this step is not required with new Gold plating technology. FIG. 4g depicts the plating of the same Copper ball parts i.e., the bottom side of each of the Copper balls that is not caught by the polymer material, with Gold 440. The Gold is plated directly on the Copper ball or on the Nickel layer, according to technology now known or developed in the future.

Figure 4H:
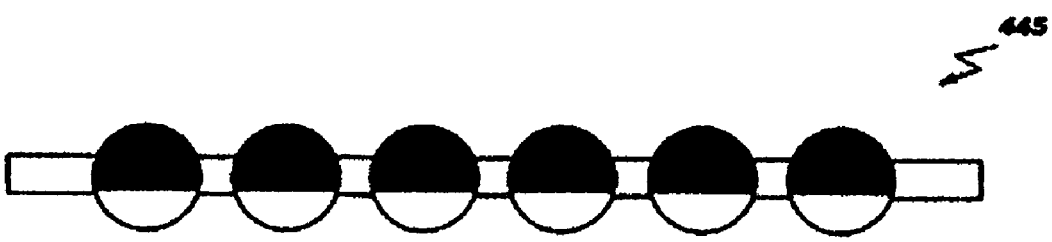

Finally, FIG. 4h illustrates the resulting thin polymer layer 445, or foil, embedding oriented half plated Copper balls.

Figure 5:
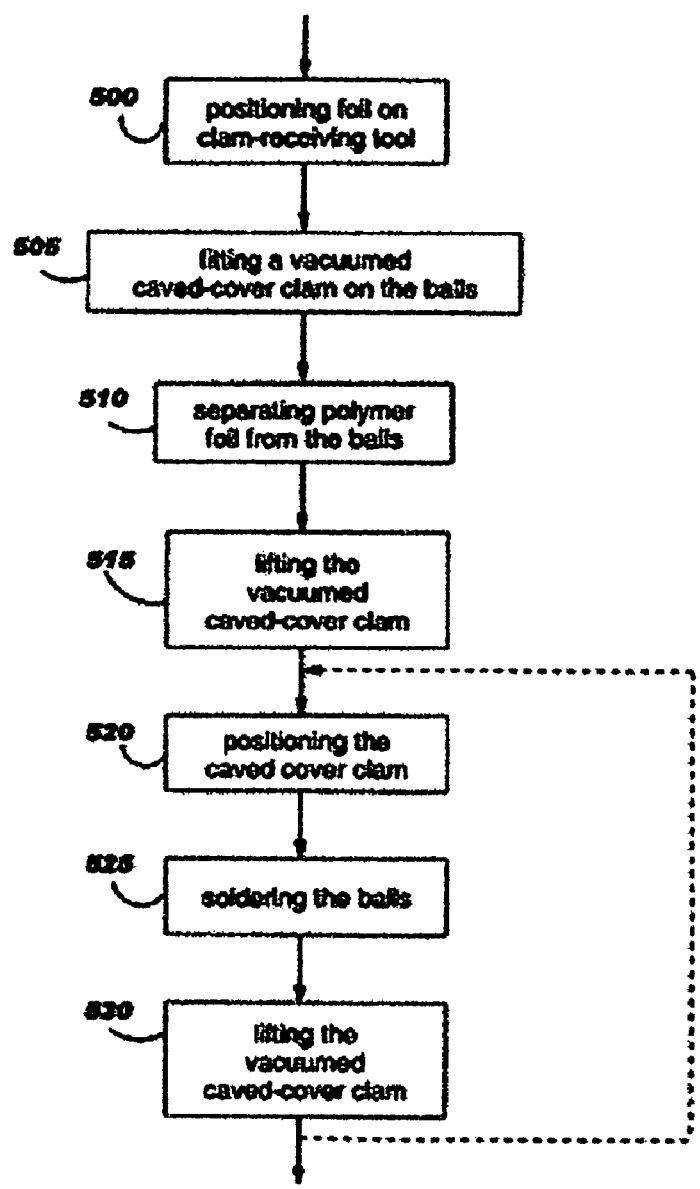
FIG. 5 illustrates an example of the main steps of the method for handling and positioning half plated balls according to the invention.

According to the method of the invention, the half plated balls are extracted individually from the thin polymer foil so as to control their orientation. FIG. 5 illustrates the main steps of an example of an algorithm implementing the method of the invention. FIG. 6 illustrates the main steps of the algorithm shown on FIG. 5. For sake of illustration, FIGS. 5 and 6 are jointly described.

Figure 6A:
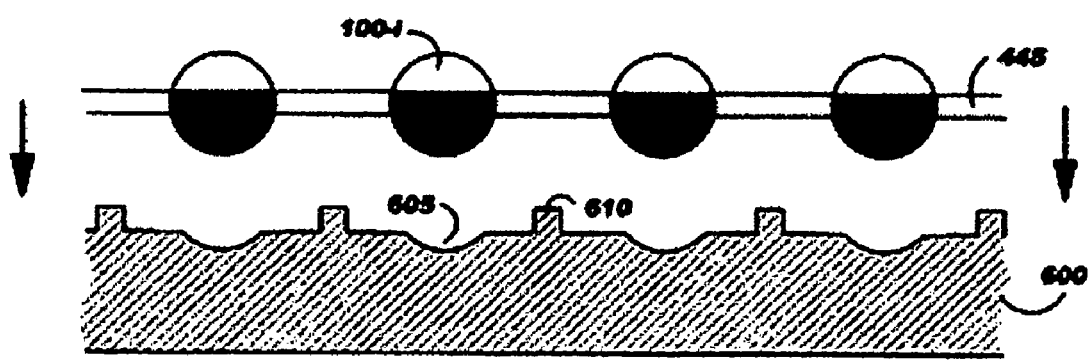
FIGS. 6a to 6h, illustrates the main steps of the method depicted on FIG. 5.
Figure 6B:
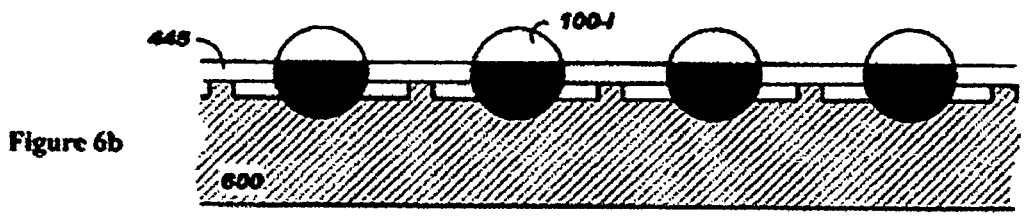
Figure 6C:
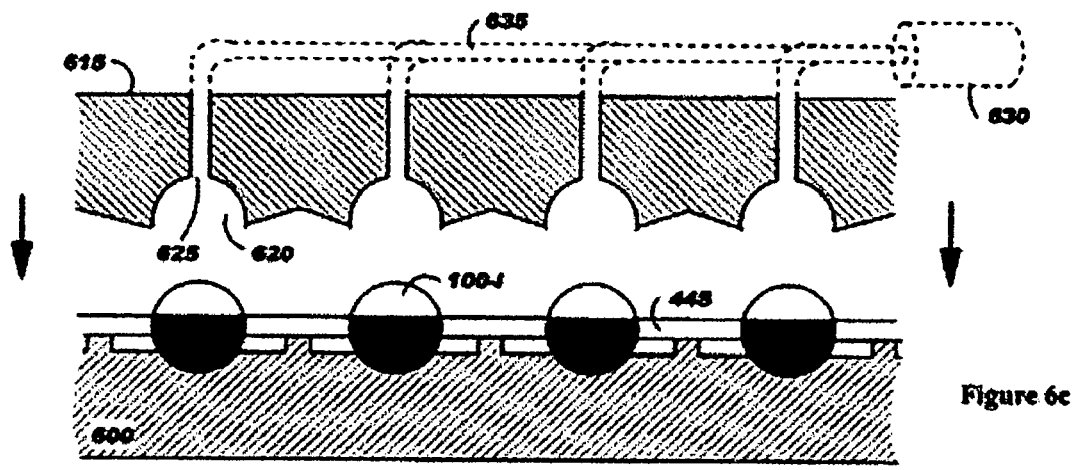
Figure 6D:
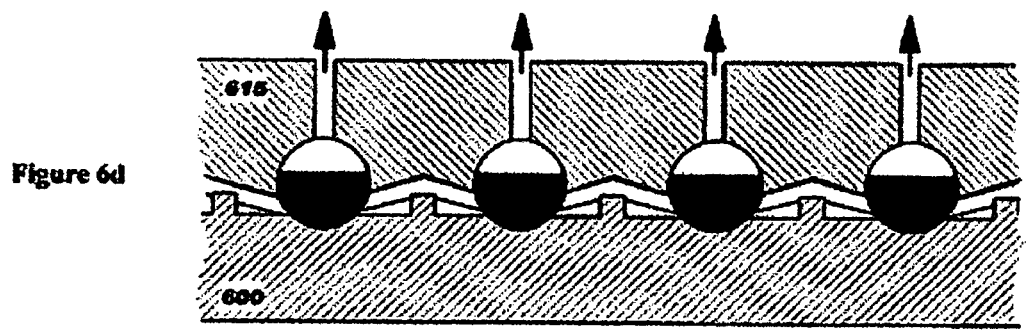

FIG. 5 depicts an example of the method of the invention for handling and positioning half plated balls 100-$i$ when these half plated balls are all oriented according to a common direction and embedded in a polymer foil 445 as shown on FIG. 6a. The first step consists in positioning the foil embedding the half plated oriented balls 100-$i$ on a clam receiving tool 600 that mainly consists in a planar surface (step 500). In a preferred embodiment, the clam receiving tool 600 comprises cavities, generically referred to as 605, and protuberances, generically referred to as 610. The cavities are aligned with the balls while the protuberances are not, as illustrated on FIG. 6a. Still in a preferred embodiment, the depth of the cavities and the height of the protuberances are approximately equal to half of the distance corresponding to the height to which the balls protrude the polymer foil so that the balls hit the bottom of the cavities when the polymer foil is laid down on the protuberances as shown on FIG. 6b.

A vacuumed caved-cover clam 615 is fitted on the balls (step 505) and then pushed to cut and separate the polymer foil 445 from the Copper ball surface (step 510). The vacuumed caved-cover clam comprises cavities, generically referred to as 620, each of them having approximately the size of a half ball. An aperture, generically referred to as 625, linked to a vacuum pump 630 by means of pipes 635, is provided in each of the cavities as illustrated on FIG. 6c (for sake of clarity the vacuum pump and pipes are shown with dotted lines). Naturally, the cavities must be approximately aligned to the balls embedded in the polymer foil. As illustrated on FIG. 6d, when the vacuumed caved-cover is fitted on the balls, it pushes on the polymer foil and the balls are detached. This action is helped by the protuberances 610 however, even if the clam receiving tool does not comprise cavities nor protuberances, the balls are detached from the polymer foil by the action of the vacuumed caved-cover clam on the polymer foil.

The vacuum is preferably done when picking the spheres and separating them away from the polymer foil. It is held until the spheres are placed onto the chip carrier substrate. It should be understood that, as an alternative to vacuum, a type of soft glue can be used to maintain balls in cavities during handling. In such a case, the glue must be soft enough to free the ball after it has been soldered. For example the soft glue can be a "sticky" material that undergoes physical changes once subjected to the thermal cycle used in the soldering operation, freeing spheres i.e., by molecular thermal breakdown, while they are being soldered.

Figure 6E:
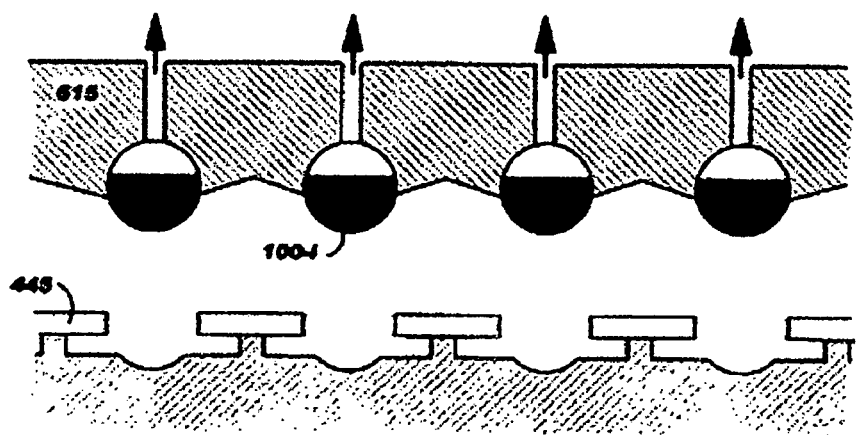

When the balls 100-i are detached from the polymer foil 445, the vacuumed caved-cover clam 615 is lifted with the oriented balls entrapped inside (step 515) as depicted on FIG. 6e. By maintaining the vacuum in the cavities entrapping the balls, the caved-cover clam 615 can be moved with the entrapped balls 100-i so as to position the balls above the electronic module or modules (step 520) wherein the balls must be soldered as shown on FIG. 6f. At this stage, a treatment can be done on the parts of the balls that are outside of the caved-cover clam cavities or solder alloy can be deposited on them.

If solder alloy is not deposited on the balls it should be deposited on the pads of the chip carriers. In this case, the chip carriers on which the balls must be positioned can be pre-treated prior to ball placement according to different ways. In a first embodiment, the solderpads of the carriers are dressed with solder alloy preventively reflowed, referred to as pre-solder finished carriers in the industry, i.e., the solder alloy was placed onto the pads and has underwent a reflow to form a solid metal shape adapted to receive the spheres. Before placing the spheres, these shapes are wetted by a decapping agent, or solder flux, that can be sticky, helping to hold the spheres in place. This process allows one to control effectively the amount of solder alloy that will react with the spheres finishing and to keep the amount of flux at the minimum value, the flux is being placed in a controlled way over the substrate e.g., liquid spray or microdrops.

According to a second embodiment, the substrate pads are prepared with a controlled quantity of solder paste that can be, for example, deposited by a screen printing method. The spheres are placed in contact with these paste deposits. The soldering is preferably done when the caved-cover clam holds the spheres in placed while the temperature can be raised to achieve the solder alloy melting point. When the required working temperature is reached, the vacuum is stopped and the caved-cover clam is raised, leaving the assembly to cool down on its own. Alternatively, the caved-cover clam can be removed when the spheres have been placed into the holding material i.e., sticky flux or solder paste. In this case, the substrate and spheres are then brought to the solder alloy melting temperature without any mechanical constraint to the ball position.

Figure 6F:
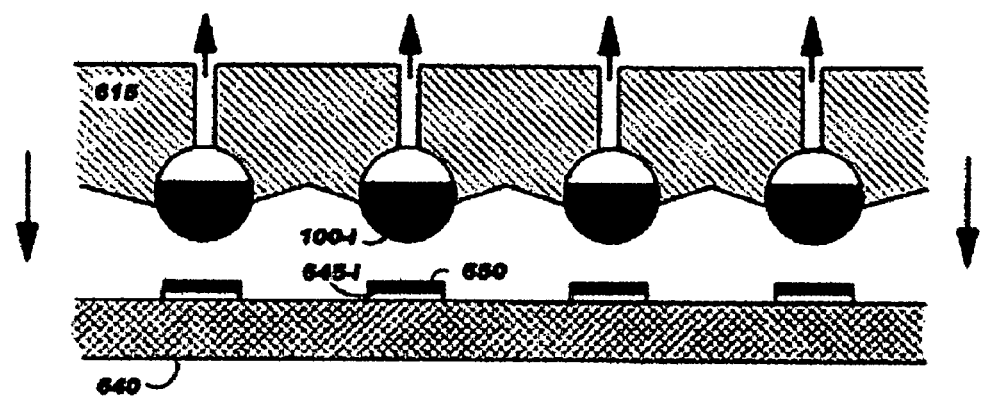
Figure 6G:
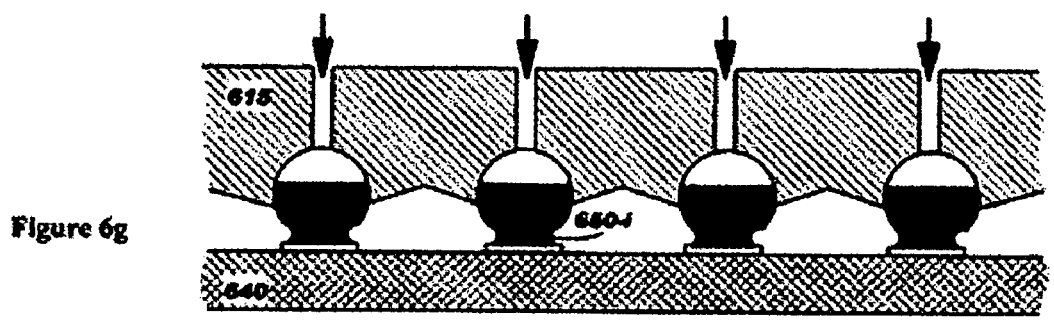
Figure 6H:
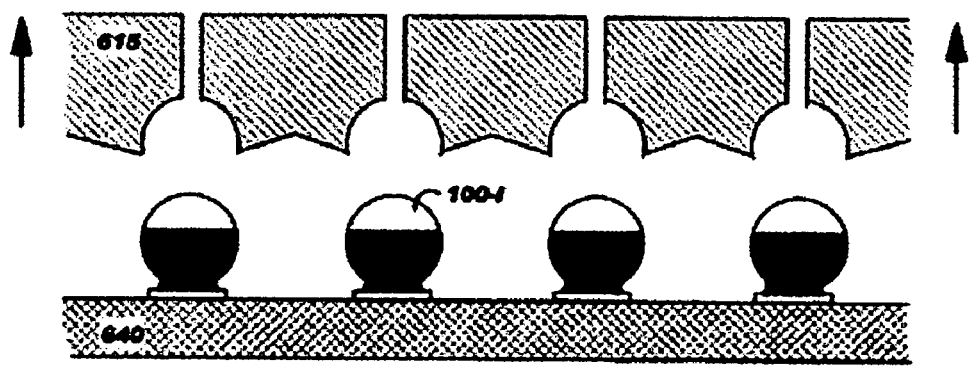

As depicted on FIG. 6f, the electronic module 640 on which the balls must be soldered comprises pads generically referred to as 645-i. On each of the pads 645-i, solder alloy 650 is deposited before the balls are positioned as described above. Then the balls are soldered using a standard soldering process (step 525) and the vacuum of the cavities entrapping the balls is ended when the solder alloy melting temperature is reached across the whole working piece as illustrated on FIG. 6g. After ending the vacuum the caved-cover clam 615 is raised away, or lifted, from the chip carrier, as shown on FIG. 6h, to free the balls 100-i (step 530).

Depending upon the soldering process and the relative position between the cavities entrapping balls and the pads of the electronic devices wherein the balls must be soldered, only a subset of the balls may be soldered simultaneously. In such case, the caved-cover clam is positioned to solder a first subset of balls, then the vacuum is ended only for the cavities corresponding to the balls that have been soldered, the caved-cover clam is lifted and repositioned to solder a second subset as illustrated with dotted line on FIG. 5 i.e., steps 520 to 530 can be executed as many times as required. Such process can be easily done by depositing selectively solder alloy on the pads and by ending only partially vacuum in the cavities 620.

Screen printing of large arrays of matrixes is often used on high mass production of low cost module devices. However, since the areas involved in the solder paste screen printing are large and the products are low cost, it should be required to accept a high variability in the quantity and characteristics of solder paste deposited by the screen printing operation. To specifically address such a low cost mass production implementation, a solder wetting flow limiting barrier is preferably embedded into the coating manufacturing of the balls. This is done by inserting an oxidation step of the copper spheres prior to proceed with the resin encapsulation. This extra step delivers a better control of the self positioning of the coated metal spheres during soldering operation, especially when used as a combination of screened solder paste deposition over the chip carrier substrate pads.

Once the spheres are released from the vacuum placing-head, or caved-cover clam, and are in touch with oversized deposits of wet solder paste, there is the possibility that the wetting forces of the liquid part of the solder paste, exercise some rotational effects against the spheres. As a consequence, the spheres can loose their original orientation "as placed". Furthermore, if a similar wetting phenomena can exist along the whole surface of the freed spheres during the soldering operation i.e., all different metallizations are wettable by the liquid solder, they may continue to rotate along their own center during solder reflow, loosing completely their orientation.

To allow mass production and a self-correcting process of the sphere orientation it is possible to create a precise three level surface finishing where the two ends i.e., exposed solderable copper and gold portions, are separated by a central region of oxidized copper that is not readily wettable by solder alloys without a strong support of decapping agents such as organic fluxes that are not provided into the process. The wetting forces balance of the melted alloy drive the same alloy to embrace the total wettable surface area (exposed and not oxidized copper area) achieving a minimum energy configuration that results into a spatial self correcting rotational re-alignment of the spheres. The copper oxidized portion stops very effectively the travel of the solder alloys along the opposite end of the spheres avoiding any possible contact between the solders and the different metallization i.e., tin and gold.

The partial oxidation of the spheres is obtained after step 300 of FIG. 3 by exposing the obtained stack of clams and spheres to an oxidizing atmosphere i.e., an adapted couple of temperature and air/oxygen, for a short cycle. Then the process continues as previously explained with step 305, embedding the center of the oxidized spheres in a polymer material.

The following plating process steps consisting in particular in depositing nickel or other metals (step 325 of FIG. 3) comprises sub-steps that re-activate the copper surface prior to applying the new metal i.e., that remove oxides. Therefore the oxide layers of the two opposite sides of the spheres will be removed at different times (or at the same time, revisiting accordingly the flow presented on FIG. 3), leaving the central portion of the spheres with its own oxide barrier in place since it is protected by the polymer sheet. Once extracted from the polymer sheet by the placing head, the spheres have three metal surface finishing, allowing an improved positioning of the spheres as described above.

Figure 7:
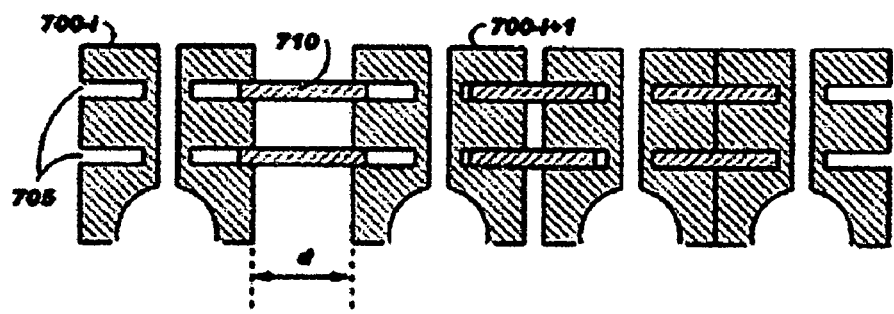
FIG. 7 shows an example of caved-cover clam allowing to adjust dynamically the distances between balls when they are positioned.

In another embodiment, the caved-cover clam is made of individual parts comprising one or more cavities for handling oriented half plated balls. In this embodiment, the space between each individual part can be dynamically modified so as to adjust the positioning of the oriented half plated balls. FIG. 7 shows a partial view of a caved-cover according to this embodiment. As depicted, each of the parts e.g., parts 700-$i$ and 700-$i$+1, comprises a cavity adapted to entrap a ball and an aperture for vacuum purpose as disclosed above. Each of the part also comprises a sliding mechanism that consists, in this example of holes, generically referred to as 705, and beams, generically referred to as 710, allowing one to adjust the distance d between the caved-cover clam parts. The distance d can be controlled, for example, by means of threaded metal rods and taped holes or equivalent system. Depending upon the system, the distances between each part could be equal or not. In the given example shown on FIG. 7, the distances can be different as illustrated i.e., the distance between parts 700-$i$ and 700-$i$+1 is not the same as the distance between parts 700-$i$+1 and the one that is on its right. Naturally, the distance between each of the parts embedding cavities for entrapping balls can be adjusted according to X and Y directions for adjusting the position of each of the oriented half plated balls in respect to BGA package requirements.

Figure 8:
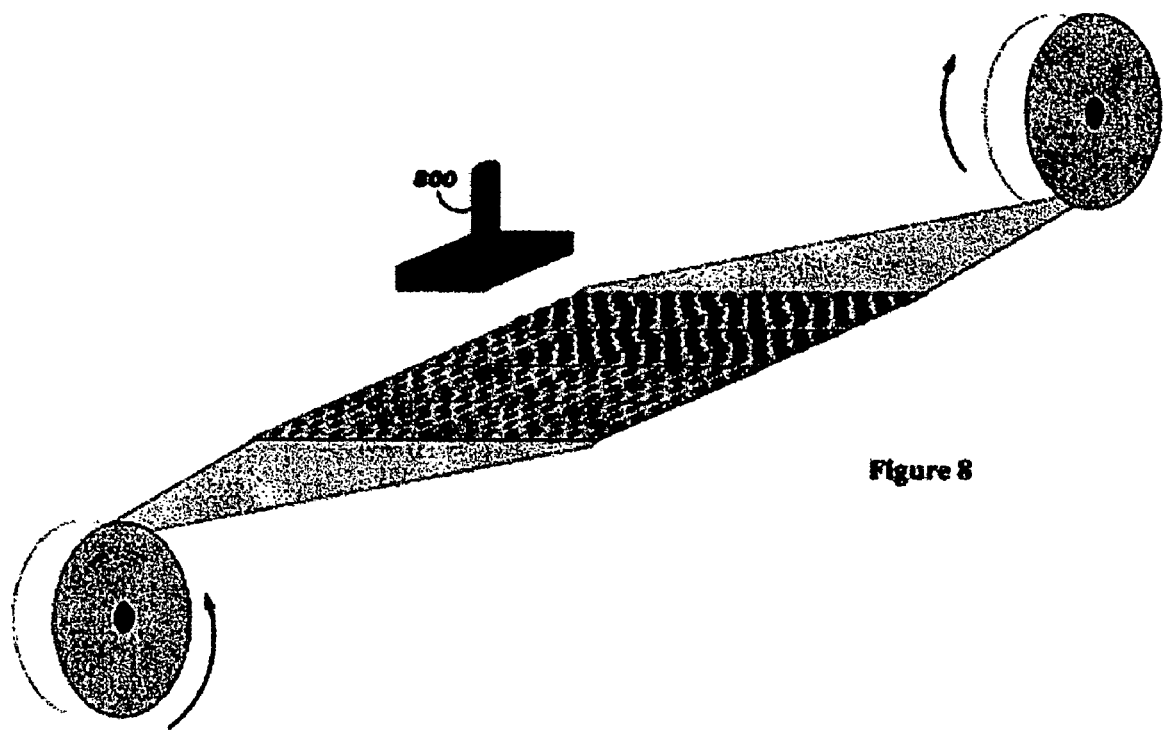
FIG. 8 depicts an example of tape feeding reel system for providing soft foil portion embedding oriented half plated balls to handling mechanism.

FIG. 8 depicts an example of a mechanism based on a tape feeding reel that can be used to provide foil portion embedding oriented half plated balls to a handling and positioning tool 800.

Naturally, in order to satisfy local and specific requirements, a person skilled in the art may apply to the solution described above many modifications and alterations all of which, however, are included within the scope of protection of the invention as defined by the following claims.

What is claimed is:

1. A method for handling at least one oriented half plated ball embedded in a foil such that said at least one oriented half plated ball protrudes on both faces of said foil, using a caved-cover clam comprising at least one cavity having the shape and the size of approximately half of said half plated ball, said method comprising the steps of:
    positioning said foil comprising said at least one oriented half plated ball on a clam receiving tool;
    positioning the caved-cover clam so that said at least one cavity fits on said at least one oriented half plated ball wherein said positioning operates to separate said foil from said at least one oriented half plated ball;
    lifting the caved-cover clam entrapping said at least one oriented half plated ball in said at least one cavity;
    positioning the caved-cover clam according to the target position of said at least one oriented half plated ball;
    freeing said at least one oriented half plated ball; and,
    lifting the caved-cover clam.

2. The method of claim 1 further comprising the step of vacuuming said at least one cavity before lifting the caved-cover clam entrapping said at least one oriented half plated ball.

3. The method of claim 2 wherein said step of freeing said at least one oriented half plated ball comprises the step of ending vacuum in said at least one cavity.

4. The method of claim 1 wherein said cave-cover clam comprises soft glue in said at least one cavity.

5. The method of claim 4 wherein said soft glue comprises a material that releases the spheres after undergoing a physical change driven by a thermal cycle.

6. The method of claim 1 further comprising the step of soldering said at least one oriented half plated ball.

7. The method of claim 1 wherein said caved-cover clam comprises a plurality of cavities having the shape and the size of approximately half of said half plated ball.

8. The method of claim 1 wherein said caved-cover clam comprises a plurality of parts, each of said parts comprising at least one cavity having the shape and the size of approximately half of said half plated ball.

9. The method of claim 8 wherein said the distance between cavities belonging to different parts can be adjusted.

* * * * *